United States Patent
Ma et al.

(10) Patent No.: US 7,732,887 B2
(45) Date of Patent: *Jun. 8, 2010

(54) SCHOTTKY JUNCTION DIODE DEVICES IN CMOS

(75) Inventors: Yanjun Ma, Bellevue, WA (US);
Ronald A. Oliver, Seattle, WA (US);
Todd E. Humes, Shoreline, WA (US);
Jaideep Mavoori, Bellevue, WA (US)

(73) Assignee: Virage Logic Corporation, Fremont, CA (US)

( * ) Notice: Subject to any disclaimer, the term of this patent is extended or adjusted under 35 U.S.C. 154(b) by 624 days.

This patent is subject to a terminal disclaimer.

(21) Appl. No.: 11/387,603

(22) Filed: Mar. 22, 2006

(65) Prior Publication Data

US 2006/0223247 A1 Oct. 5, 2006

Related U.S. Application Data

(60) Provisional application No. 60/667,110, filed on Mar. 30, 2005.

(51) Int. Cl.
*H01L 31/07* (2006.01)
(52) U.S. Cl. ........... 257/471; 257/371; 257/E29.265; 257/E21.053; 257/472
(58) Field of Classification Search ........... 257/371, 257/329, 471
See application file for complete search history.

(56) References Cited

U.S. PATENT DOCUMENTS

| | | | | |
|---|---|---|---|---|
| 5,962,893 A | * | 10/1999 | Omura et al. | 257/329 |
| 7,202,536 B2 | * | 4/2007 | Williams et al. | 257/371 |
| 2004/0012066 A1 | | 1/2004 | Dietl et al. | |
| 2006/0125040 A1 | * | 6/2006 | Levin et al. | 257/471 |
| 2006/0223246 A1 | | 10/2006 | Ma et al. | |

OTHER PUBLICATIONS

Office Action for U.S. Appl. No. 11/387,515 mailed Sep. 17, 2008.
Office Action for U.S. Appl. No. 11/387,515 mailed Jun. 11, 2009.

* cited by examiner

*Primary Examiner*—Fernando L Toledo
*Assistant Examiner*—Mamadou Diallo
(74) *Attorney, Agent, or Firm*—Nixon Peabody LLP; David B. Ritchie

(57) ABSTRACT

A Schottky junction diode device having improved performance is fabricated in a conventional CMOS process. A substrate including a material doped to a first conductivity type is formed. A first well is disposed over the substrate. The first well includes a material doped to a second conductivity type opposite that of the first conductivity type. A region of metal-containing material is disposed over the first well to form a Schottky junction at an interface between the region of metal-containing material and the first well. In one embodiment, a first well contact is disposed in a portion of the first well. A second well is disposed over the substrate wherein the second well includes a material doped to the first conductivity type. In one embodiment, the first well and the second well are not in direct contact with one another.

16 Claims, 2 Drawing Sheets

SCHOTTKY JUNCTION DIODE DEVICES IN CMOS

STATEMENT OF RELATED CASES

This patent application claims priority from United States Provisional Patent Application Ser. No. 60/667,110 filed on Mar. 30, 2005 and entitled "Schottky Diodes in CMOS" in the names of the same inventors and commonly owned herewith.

This patent application may also be considered to be related to U.S. patent application Ser. No. 11/387,515, filed on Mar. 22, 2006 and entitled "Schottky Junction Diode Devices in CMOS With Multiple Wells", in the names of the same inventors and commonly owned herewith. That patent application claims priority from United States Provisional Patent Application Ser. No. 60/667,109 filed on Mar. 30, 2005 and entitled 'Schottky Diodes in CMOS" in the names of the same inventors and commonly owned herewith.

FIELD OF THE INVENTION

The present invention relates generally to the field of semiconductors. More specifically, the present invention relates to Schottky junction diode devices fabricated in complementary metal oxide semiconductor (CMOS) fabrication processes and methods for carrying out such processes.

BACKGROUND OF THE INVENTION

Schottky diodes have been widely used in high frequency integrated circuits because of their unique capabilities for fast switching with a low voltage drop. Many semiconductor devices have employed Schottky junction diode devices because of their unique characteristics. Instead of a semiconductor to semiconductor junction as a barrier in a conventional semiconductor diode, the Schottky junction diode device uses a metal to semiconductor junction, also known as Schottky junction, as its barrier. Since conventional complementary metal oxide semiconductor (CMOS) integrated circuits generally do not employ Schottky junction diodes, Schottky junction diodes are not known to be available in standard CMOS semiconductor fabrication processes. Schottky junction diodes of the prior art require specialized semiconductor fabrication processes.

FIG. 1 is an elevational cross-sectional drawing illustrating a conventional Schottky junction diode device 100 formed in silicon (Si) in accordance with the prior art. Device 100 includes a p– substrate 102, an n– well 104 and a p– well 106. A metal-containing layer 108 is formed in contact with n– well 104 to form a Schottky junction 110 at the interface between the metal-containing layer 108 and the silicon of n– well 104. The p– well 106 is contacted or substantially contacted to n– well 104 at interface 112. A substrate contact 114 is provided for the device at p– well 106. Substrate contact 114 is used for biasing the substrate. One or more n– well contacts 116a, 116b are provided at n– well 104. The Schottky junction diode is defined between metal-containing layer 108 and n– well contact 116a or 116b. A drawback associated with this conventional approach is that there is a relatively high capacitance created between the wells 104 and 106 which limits the performance of the Schottky junction diode device 100.

Therefore, there is a need in the art to improve Schottky junction diode devices so that they may exhibit higher performance and be fabricated in conventional CMOS process environments.

SUMMARY OF THE INVENTION

A Schottky junction diode device having improved performance is fabricated in a conventional CMOS process. A substrate including a material doped to a first conductivity type is formed. A first well is disposed over the substrate. The first well includes a material doped to a second conductivity type opposite that of the first conductivity type. A region of metal-containing material is disposed in the first well to form a Schottky junction at an interface between the region of metal-containing material and the first well. In one embodiment, a first well contact is disposed in a portion of the first well. A second well is disposed over the substrate wherein the second well includes a material doped to the first conductivity type. In one embodiment, the first well and the second well are not in direct contact with one another.

Other aspects of the inventions are described and claimed below, and a further understanding of the nature and advantages of the inventions may be realized by reference to the remaining portions of the specification and the attached drawings.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1:
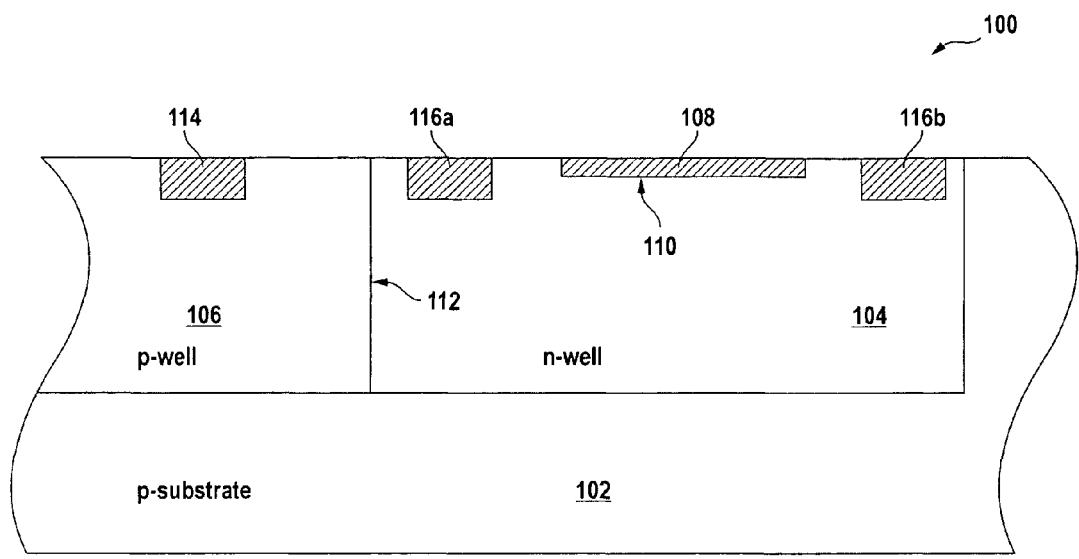
FIG. 1 is an elevational cross-sectional drawing illustrating a conventional Schottky junction diode device in accordance with the prior art.

Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. Where appropriate, the same reference indicators will be used throughout the drawings and the following detailed description to refer to the same or similar parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

As used herein, the symbol n+ indicates an n-doped semiconductor material typically having a doping level of n-type dopants on the order of $10^{20}$ atoms per cubic centimeter or more. The symbol n− indicates an n-doped semiconductor material (such a silicon (Si), germanium (Ge), Gallium Arsenide (GaAs), and the like) typically having a doping level on the order of $10^{17}$ atoms per cubic centimeter for n− doped wells and on the order of $10^{15}$ atoms per cubic centimeter for n− substrate material. The symbol p+ indicates a p-doped semiconductor material typically having a doping level of p-type dopants on the order of $10^{20}$ atoms per cubic centimeter or more. The symbol p− indicates a p-doped semiconductor material typically having a doping level on the order of $10^{17}$ atoms per cubic centimeter for p− doped wells and on the order of $10^{15}$ atoms per cubic centimeter for p− substrate material. Those of ordinary skill in the art will now realize that a range of doping concentrations around those described above will also work. Furthermore, the devices described herein may be formed on a conventional semiconductor substrate or they may as easily be formed as a thin film transistor (TFT) above the substrate, or in silicon on an insulator (SOI) such as glass (SOG), sapphire (SOS), or other substrates as known to those of ordinary skill in the art. Essentially, any process capable of forming pFETs and nFETs will work. Doped regions may be diffusions or they may be implanted. When it is said that something is doped at approximately the same level as something else, the doping levels are within a factor of ten of each other, e.g., $10^{16}$ is within a factor of ten of $10^{15}$ and $10^{17}$.

In accordance with an embodiment of the present invention, an improved Schottky junction diode device fabricated in a conventional CMOS process and exhibits improved performance through reduced junction capacitance. In one embodiment, a technique of separating the p− well from the n− well of the Schottky junction diode device is utilized to reduce the junction capacitance. This embodiment introduces a technique for fabricating such Schottky junction diode devices in a conventional CMOS process. In one embodiment, a first well is disposed over a first region of a substrate. A region of metal-containing material (which may be in the form of a layer or another structure) is disposed within a portion of the first well to form a Schottky junction at an interface between the metal-containing material and the first well. A second well is disposed over a second region of the substrate wherein the second well and the first well are separated from one another by a region of the substrate.

Figure 2:
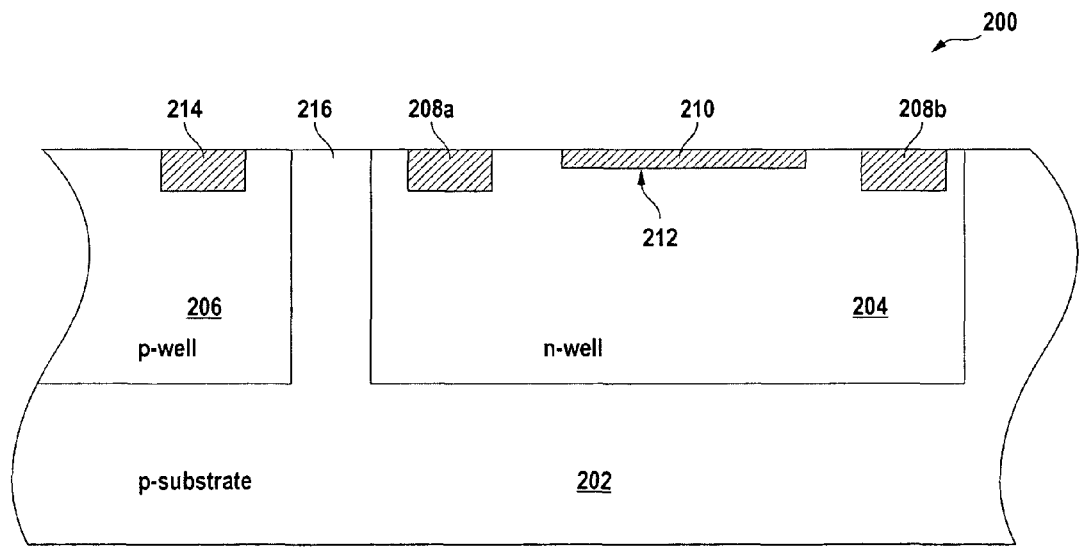
FIG. 2 is an elevational cross-sectional drawing illustrating a Schottky junction diode device in accordance with one embodiment of the present invention.

FIG. 2 is an elevational cross-sectional drawing illustrating a Schottky junction diode device 200 in accordance with one embodiment of the present invention. In this embodiment, which may be fabricated using a conventional CMOS process in silicon, for example, device 200 includes a substrate 202, a first well 204 and a second well 206.

First well 204 is provided with one or more electrically conductive first well contacts 208a and optionally, 208b. These contacts may be point contacts (e.g., small compared to the size of the first well and of a shape that is round, rectangular, square or the like) and may be formed of any suitable conductive material as would be known to those of ordinary skill in the art. Such materials include one or a combination of any of: p+ doped or n+ doped semiconductor (such as heavily doped polysilicon, for example), titanium, titanium silicide, cobalt, cobalt silicide, nickel, nickel silicide, tungsten, tungsten silicide, gold, manganese, hafnium, silver, aluminum, palladium or platinum. Alternatively, first well contact 208a may be disposed in other shapes such as a line or a closed loop on the surface of device 200 (such as a rectangle, square, circle or the like) which may surround the metal-containing region 212 (see below). In such a case it could also encompass well contact 208b.

A region of metal-containing material 210 is formed in contact with n− well 204 to form a Schottky junction 212 at the interface between the region of metal-containing material 208a and the semiconductor material of n− well 204. The Schottky junction diode is defined between the region of metal-containing material 210 and well contact 208a or 208b. A substrate or body contact 214 is provided at second well 206. In one embodiment, first well 204 and second well 206 are physically separated by portion 216 of substrate 202. An advantage of separating the wells is to reduce junction capacitance over designs where the first and second wells are in direct physical contact, as shown in FIG. 1. Note that an oxide may be formed along the surface of the substrate 202. In addition, the oxide may end up disposed between the region of metal containing material 210 and well contact 208a.

Referring in more detail to FIG. 2, substrate 202 includes a semiconductor material doped to a first conductivity type. In one embodiment, the first conductivity type is p− and the material may be p− doped silicon (Si). First well 204 is disposed over substrate 202 wherein first well 204 includes a semiconductor material doped to a second conductivity type opposite that of the first conductivity type. In one embodiment, the second conductivity type is n− material such as n− doped silicon. A region of metal-containing material 210 (which may serve as or is electrically coupled to a Schottky contact) is disposed over first well 204 to form a Schottky junction at an interface 212 between the region of metal-containing material 210 and first well 204. In one embodiment, first well contacts 208a, 208b may be a single contact (i.e., they are joined out of the plane of the cross-section). A second well 206 is disposed over substrate 202 wherein second well 206 includes a semiconductor material doped to the first conductivity type such as p-doped material which may be p− doped silicon. Device 200, in one embodiment, further includes a second well contact 214, which is an electrical contact for second well 206 and provides an electrical path for biasing the substrate 202. A region 216 of substrate 202 is disposed between first well 204 and second well 206. In one embodiment, first well contact 208a is formed in a closed loop shape which surrounds or substantially surrounds Schottky contact 208a (including contact 208b). In other words, first well contact 210 is shaped as a rectangle, square, circle or the like surrounding the region of metal-containing material 210. The region of metal-containing material 210 may be of any practical shape surrounded by first well contact 208a. Alternatively, the first well contact 208a may be formed as a more conventional square or circular point contact.

As used herein, the semiconductor material may be any appropriate semiconductor material such as silicon (Si), germanium (Ge), gallium arsenide (GaAs) or the like. The region of metal-containing material 210 may comprise at least one or more of the following materials: titanium, titanium silicide, cobalt, cobalt silicide, nickel, nickel silicide, tungsten, tungsten silicide, gold, manganese, hafnium, silver, aluminum, palladium or platinum. Contacts 208a, 208b and 214 may comprise one or more of these materials as well as highly doped semiconductor such as n+ or p+ polysilicon, for example.

Figure 3:
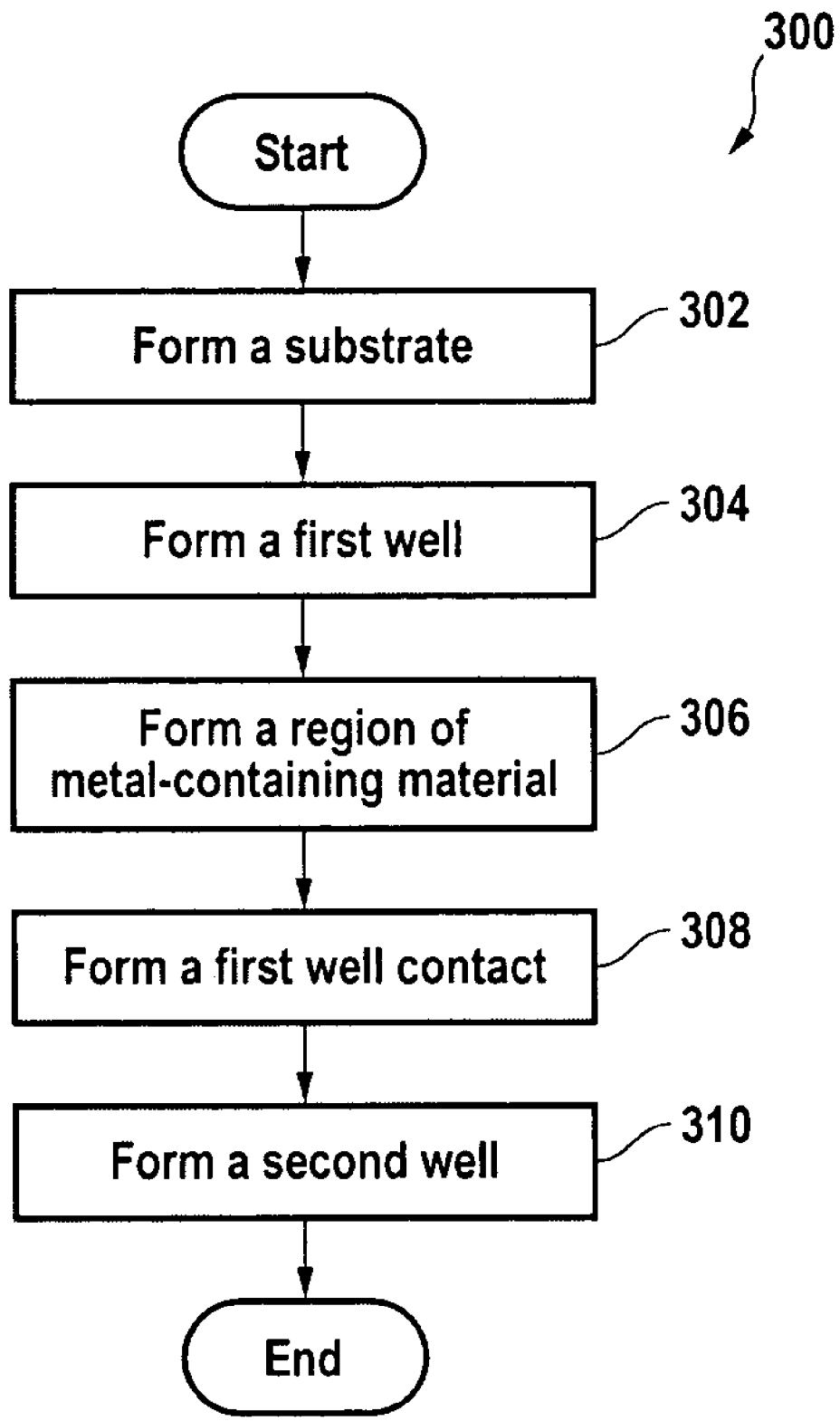
FIG. 3 is a flowchart illustrating a method for manufacturing Schottky diode devices in a conventional CMOS process in accordance with one embodiment of the present invention.

FIG. 3 is a flowchart illustrating a method or process 300 for manufacturing Schottky junction diode devices in a conventional CMOS process in accordance with one embodiment of the present invention. At block 302, the process creates a substrate that includes a material doped to a first conductivity type. In one embodiment, the material doped to the first conductivity type is p– doped semiconductor material. In another embodiment, the material doped to a first conductivity type is n– semiconductor material. The p– material, in one example, includes silicon. In another example, the p– doped material includes germanium (Ge), gallium arsenide (GaAs), or the like. Once the substrate is properly doped and formed, the process moves to the next block. Such substrate materials may be purchased from fabricators thereof.

At block 304, the process disposes a first well over the substrate. The first well includes a material doped to a second conductivity type opposite to that of the first conductivity type. For example, if the substrate is a p– type semiconductor, the first well would be an n– type semiconductor material. After the first well is formed, the process moves to the next block.

At block 306, the process disposes a region of metal-containing material over the first well to create a Schottky junction 212 at an interface between the region of metal-containing material 210 and the first well 204. In one embodiment, a conductive region of metal-containing material is deposited or formed over a portion of the first well to create the metal-semiconductor (Schottky) junction 212. The region of metal-containing material 210 may include metal materials as described above. The process moves to the next block.

At block 308, the process disposes a first well contact as an electrical contact in the first well. In one embodiment, the first well contact is formed in a closed loop shape which surrounds the region of metal-containing material 210 as discussed above in detail. Alternatively a point contact may be used. The region of metal-containing material 210 may be a conventional point contact or, alternatively, it may have a different shape such as a rectangle, square, circle or the like. Those of ordinary skill in the art will now realize that other shapes, such as rounded or oval shapes, may be used as well. After the deposition of the first well contact, the process moves to the next block.

At block 310, the process disposes a second well over the substrate. The second well includes a material doped to the first conductivity type. The first well and the second well are formed so that they are not in direct contact with one another. In one embodiment, a second well contact is deposited over a portion of the second well for electrical connections to and from the second well. A region of the substrate may be disposed between the first well 204 and the second well 206 to separate the first well 204 from the second well 206.

Those of ordinary skill in the art will now realize that some of the process steps described above may be performed in different sequences or simultaneously, accordingly, the invention is not limited to a process of steps carried out in the explicit order recited.

While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope all such changes and modifications as are within the true spirit and scope of this invention.

What is claimed is:

1. A Schottky junction diode device, comprising:
   a substrate including a material doped to a first conductivity type;
   a first well disposed in said substrate, said first well including a material doped to a second conductivity type opposite that of the first conductivity type;
   a region of metal-containing material disposed in the first well to form a Schottky junction at an interface between the region of metal-containing material and the first well;
   a first well contact in electrical contact with the first well;
   a second well disposed in said substrate, the second well including a material doped to the first conductivity type, the first well and the second well not being in direct contact with one another; and
   a region of the substrate disposed between the first well and the second well,
   wherein the first well contact is formed in a closed loop shape which surrounds the Schottky junction.

2. The device of claim 1, further comprising:
   a second well contact in electrical contact with the second well.

3. The device of claim 1, wherein the closed loop shape is a rectangle.

4. The device of claim 1, wherein the substrate material doped to a first conductivity type is p-doped.

5. The device of claim 1, wherein the substrate material doped to a first conductivity type is n-doped.

6. The device of claim 4, wherein the p-doped substrate material comprises silicon.

7. The device of claim 4, wherein the p-doped substrate material comprises gallium arsenide.

8. The device of claim 1, wherein the region of metal-containing material comprises one or more of the materials selected from the group consisting of: titanium, titanium silicide, cobalt, cobalt silicide, nickel, nickel silicide, tungsten, tungsten silicide, gold, manganese, hafnium, silver, aluminum, palladium and platinum.

9. A method for manufacturing a Schottky junction diode device comprising:
   forming a substrate including a material doped to a first conductivity type;
   forming a first well disposed in said substrate, said first well including a material doped to a second conductivity type opposite that of the first conductivity type;
   forming a region of metal-containing material disposed in the first well to create a Schottky junction at an interface between the region of metal-containing material and the first well;
   forming a first well contact in electrical contact with the first well;
   forming a second well disposed in said substrate, the second well including a material doped to the first conductivity type, the first well and the second well not being in direct contact with one another; and
   forming a region of the substrate disposed between the first well and the second well,
   wherein the first well contact is formed in a closed loop shape which surrounds the Schottky junction.

10. The method of claim 9, further comprising:
    forming a second well contact in electrical contact with the second well.

11. The method of claim 9, wherein the closed loop shape is a rectangle.

12. The method of claim 9, wherein the substrate material doped to a first conductivity type is p-doped.

13. The method of claim 9, wherein the substrate material doped to a first conductivity type is n-doped.

14. The method of claim 12, wherein the p-doped substrate material comprises silicon.

15. The method of claim 12, wherein the p-doped substrate material comprises gallium arsenide.

16. The method of claim 9, wherein the region of metal-containing material comprises one or more of the materials selected from the group consisting of: titanium, titanium silicide, cobalt, cobalt silicide, nickel, nickel silicide, tungsten, tungsten silicide, gold, manganese, hafnium, silver, aluminum, palladium and platinum.

* * * * *